(12) United States Patent
Zhang et al.

(10) Patent No.: US 9,602,141 B2
(45) Date of Patent: Mar. 21, 2017

(54) HIGH-SPEED MULTI-BLOCK-ROW LAYERED DECODER FOR LOW DENSITY PARITY CHECK (LDPC) CODES

(71) Applicant: SANDISK ENTERPRISE IP LLC, Dallas, TX (US)

(72) Inventors: Xinmiao Zhang, Seattle, WA (US); Ying Yu Tai, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 99 days.

(21) Appl. No.: 14/257,800

(22) Filed: Apr. 21, 2014

(65) Prior Publication Data

US 2015/0301887 A1    Oct. 22, 2015

(51) Int. Cl.
*H03M 13/00*    (2006.01)
*H03M 13/11*    (2006.01)
*G11C 29/04*    (2006.01)

(52) U.S. Cl.
CPC ..... *H03M 13/616* (2013.01); *H03M 13/1102* (2013.01); *H03M 13/114* (2013.01); *H03M 13/116* (2013.01); *H03M 13/1111* (2013.01); *H03M 13/6502* (2013.01); *G11C 2029/0411* (2013.01)

(58) Field of Classification Search
CPC ............ H03M 13/616; H03M 13/1102; G11C 2029/0411
See application file for complete search history.

(56) References Cited

U.S. PATENT DOCUMENTS

| | | |
|---|---|---|
| 7,990,290 B1 | 8/2011 | Jagmohan et al. |
| 8,418,023 B2 * | 4/2013 | Gunnam ............ H03M 13/1177 714/752 |
| 8,443,271 B1 | 5/2013 | Zhang et al. |
| 8,516,347 B1 | 8/2013 | Li et al. |
| 8,667,361 B1 | 3/2014 | Varnica et al. |
| 8,751,889 B2 | 6/2014 | Zhang et al. |
| 8,751,912 B1 * | 6/2014 | Varnica ............... H03M 13/036 714/785 |
| 8,880,973 B1 | 11/2014 | Li et al. |
| 8,938,660 B1 | 1/2015 | Varnica et al. |

(Continued)

OTHER PUBLICATIONS

Cui et al. Reduced-complexity column-layered decoding and implementation for LDPC codes/ Nov. 2010, IET communications, vol. 5, Iss pp. 2177-2188.*

(Continued)

*Primary Examiner* — Sam Rizk
(74) *Attorney, Agent, or Firm* — Toler Law Group, PC

(57) ABSTRACT

High-speed multi-block-row layered decoding for low density parity check (LDPC) codes is disclosed. In a particular embodiment, a method, in a device that includes a decoder configured to perform an iterative decoding operation, includes processing, at the decoder, first and second block rows of a layer of a parity check matrix simultaneously to generate a first output and a second output. The method includes performing processing of the first output and the second output to generate a first result of a first computation and a second result of a second computation. A length of a "critical path" of the decoder is reduced as compared to a critical path length in which a common feedback message is computed.

20 Claims, 4 Drawing Sheets

(56) References Cited

U.S. PATENT DOCUMENTS

| | | | |
|---|---|---|---|
| 8,996,969 | B2 | 3/2015 | Bolotov et al. |
| 9,059,746 | B2 | 6/2015 | Dixon et al. |
| 9,153,331 | B2 | 10/2015 | D'Abreu et al. |
| 2003/0033575 | A1 | 2/2003 | Richardson et al. |
| 2004/0081073 | A1 | 4/2004 | Walton et al. |
| 2004/0252791 | A1 | 12/2004 | Shen et al. |
| 2004/0255228 | A1 | 12/2004 | Shen et al. |
| 2004/0255231 | A1 | 12/2004 | Shen et al. |
| 2004/0258177 | A1 | 12/2004 | Shen et al. |
| 2005/0028071 | A1 | 2/2005 | Shen et al. |
| 2005/0193320 | A1 | 9/2005 | Varnica et al. |
| 2005/0229090 | A1 | 10/2005 | Shen et al. |
| 2005/0268206 | A1 | 12/2005 | Tran et al. |
| 2005/0283707 | A1 | 12/2005 | Sharon et al. |
| 2006/0020870 | A1* | 1/2006 | Hocevar ............ H03M 13/1117 714/752 |
| 2006/0150055 | A1 | 7/2006 | Quinard et al. |
| 2007/0245214 | A1 | 10/2007 | Ramamoorthy |
| 2008/0028282 | A1 | 1/2008 | Zhong et al. |
| 2009/0282319 | A1 | 11/2009 | No et al. |
| 2010/0017676 | A1 | 1/2010 | Gross et al. |
| 2010/0042903 | A1* | 2/2010 | Gunnam ............ H03M 13/1111 714/780 |
| 2010/0042906 | A1 | 2/2010 | Gunnam et al. |
| 2011/0087933 | A1 | 4/2011 | Varnica et al. |
| 2011/0252286 | A1 | 10/2011 | Li et al. |
| 2011/0264979 | A1 | 10/2011 | Gunnam et al. |
| 2011/0293045 | A1 | 12/2011 | Gross et al. |
| 2012/0134446 | A1 | 5/2012 | Zhou et al. |
| 2012/0173947 | A1 | 7/2012 | Voicila et al. |
| 2012/0185744 | A1 | 7/2012 | Varnica et al. |
| 2013/0061107 | A1 | 3/2013 | Wang et al. |
| 2013/0061112 | A1 | 3/2013 | Chen et al. |
| 2013/0139022 | A1 | 5/2013 | Chen et al. |
| 2013/0156133 | A1 | 6/2013 | Gentile et al. |
| 2013/0346824 | A1 | 12/2013 | Bolotov et al. |

OTHER PUBLICATIONS

Ardakani, Masoud "Efficient Analysis, Design and Decoding of Low-Density Parity-Check Codes," Doctoral Dissertation, http://www.ece.ualberta.ca/~ardakani/Ardakani_thesis.pdf, 2004, 164 pages.

Wymeersch, Henk et al. "Log-Domain Decoding of LDPC Codes Over GF(q)," IEEE International Conference on Communications, vol. 2, Jun. 2004, pp. 772-776.

Tarable, Alberto et al. "Mapping Interleaving Laws to Parallel Turbo and LDPC Decoder Architectures," IEEE Transactions on Information Theory, vol. 50, No. 9, Sep. 2004, pp. 2002-2009.

Hocevar, Dale E. "A Reduced Complexity Decoder Architecture Via Layered Decoding of LDPC Codes," IEEE Workshop on Signal Processing Systems, Oct. 2004, pp. 107-112.

Neeb, Christian et al. "Network-on-Chip-Centric Approach to Interleaving in High Throughput Channel Decoders," IEEE International Symposium on Circuits and Systems, vol. 2, May 2005, pp. 1766-1769.

Mansour, Mohammad M. et al. "A 640-Mb/s 2048-Bit Programmable LDPC Decoder Chip," IEEE Journal of Solid-State Circuits, vol. 41, No. 3, Mar. 2006, pp. 684-698.

Darabiha, Ahmad et al. "A Bit-Serial Approximate Min-Sum LDPC Decoder and FPGA Implementation," IEEE International Symposium on Circuits and Systems, May 2006, pp. 149-152.

Declercq, David et al. "Decoding Algorithms for Nonbinary LDPC Codes Over GF (q)," IEEE Transactions On Communications, vol. 55, No. 4, Apr. 2007, pp. 633-643.

Gunnam, Kiran et al. "Multi-Rate Layered Decoder Architecture for Block LDPC Codes of the IEEE 802.11n Wireless Standard," IEEE International Symposium on Circuits and Systems, May 2007, pp. 1645-1648.

Savin, Valentin "Min-Max Decoding for Non Binary LDPC Codes," IEEE International Symposium on Information Theory, Jul. 2008, pp. 960-964.

Darabiha, Ahmad et al. "Power Reduction Techniques for LDPC Decoders," IEEE Journal of Solid-State Circuits, vol. 43, No. 8, Aug. 2008, pp. 1835-1845.

Zhou, Bo et al. "Construction of Non-Binary Quasi-Cyclic LDPC Codes by Arrays and Array Dispersions," IEEE Transactions on Communications, vol. 57, No. 6, Jun. 2009, pp. 1652-1662.

Jin, Jie et al. "An Energy Efficient Layered Decoding Architecture for LDPC Decoder," IEE Transactions on Very Large Scale Integration (VLSI) Systems, vol. 18, No. 8, Aug. 2010, pp. 1185-1195.

Lee, Kihoon et al. "A High-Speed Low-Complexity Concatenated BCH Decoder Architecture for 100 Gb/s Optical Communications," Springer Science+Business Media, LLC, Aug. 2010, 13 pages.

Sun, Yang et al. "Multi-Layer Parallel Decoding Algorithm and VLSI Architecture for Quasi-Cyclic LDPC Codes," IEEE International Symposium on Circuits and Systems, May 2011, pp. 1776-1779.

Zhang, Xinmiao et al. "Reduced-Complexity Decoder Architecture for Non-Binary LDPC Codes," IEEE Transactions on Very Large Scale Integration (VLSI) Systems, vol. 19, No. 7, Jul. 2011, pp. 1229-1238.

Chen, Xiaoheng et al. "High-Throughput Efficient Non-Binary LDPC Decoder Based on the Simplified Min-Sum Algorithm," IEEE Transactions on Circuits and Systems—I: Regular Papers, vol. 59, No. 11, Nov. 2012, pp. 2784-2794.

Li, Erbao et al. "Trellis-Based Extended Min-Sum Algorithm for Non-Binary LDPC Codes and its Hardware Structure," IEEE Transactions On Communications, vol. 61, No. 7, Jul. 2013, pp. 2600-2611.

Cai, Fang et al. "Relaxed Min-Max Decoder Architectures for Nonbinary Low-Density Parity-Check Codes," IEEE Transactions on Very Large Scale Integration (VLSI) Systems, vol. 21, No. 11, Nov. 2013, pp. 2010-2023.

Huang, et al., "A Low-Complexity Encoding of Quasi-Cyclic Codes Based on Galois Fourier Transform", Cornell University Library, arXiv.org > cs > arXiv:1301.3220v1, submitted Jan. 15, 2013, 8 pages.

Huang, et al., "Low-Complexity Encoding of Quasi-Cyclic Codes Based on Galois Fourier Transform", IEEE Transactions on Communications, vol. 62, Issue 6, Jun. 2014, 10 pages.

Zhang, Xinmiao et al. "Low Complexity Partial Parallel Architectures for Fourier Transform and Inverse Fourier Transform Over Subfields of a Finite Field," U.S. Appl. No. 14/258,679, filed Apr. 22, 2014, 44 pages.

Zhang, Xinmiao "Interleaved Layered Decoder for Low-Density Parity Check Codes," U.S. Appl. No. 14/258,843, filed Apr. 22, 2014, 34 pages.

Zhang, Xinmiao "Modified Trellis-Based Min-Max Decoder for Non-Binary Low-Density Parity-Check Error-Correcting Codes," U.S. Appl. No. 14/272,621, filed May 8, 2014, 33 pages.

Zhang, Xinmiao et al. "Encoder with Transform Architecture for LDPC Codes Over Subfields Using Message Mapping," U.S. Appl. No. 14/316,117, filed Jun. 26, 2014, 38 pages.

Zhang, Xinmiao et al. "Encoder for Quasi-Cyclic Low-Density Parity-Check Codes Over Subfields Using Fourier Transform," U.S. Appl. No. 14/316,128, filed Jun. 26, 2014, 36 pages.

Non-Final Office Action mailed Nov. 4, 2015 in U.S. Appl. No. 14/272,621, 15 pages.

Non-Final Office Action mailed Oct. 27, 2015 in U.S. Appl. No. 14/258,843, 5 pages.

Zhou et al., "Array Dispersions of Matrices and Constructions of Quasi-Cyclic LDPC Codes Over Non-Binary Fields", IEEE International Symposium on Information Theory, Toronto, Canada, Jul. 6-11, 2008, 1158-1162.

Final Office Action mailed Mar. 1, 2016 in U.S. Appl. No. 14/272,621, 17 pages.

Notice of Allowance mailed Mar. 15, 2016 in U.S. Appl. No. 14/258,843, 5 pages.

\* cited by examiner

HIGH-SPEED MULTI-BLOCK-ROW LAYERED DECODER FOR LOW DENSITY PARITY CHECK (LDPC) CODES

FIELD OF THE DISCLOSURE

The present disclosure is generally related to a high-speed multi-block-row layered decoder for low density parity check (LDPC) codes.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

Many different decoding techniques (e.g., decoding schemes) are available to decode encoded data used in digital communication and storage systems, such as in non-volatile data storage devices. For example, low-density parity-check (LDPC) codes are error correcting codes (e.g., decoding codes) used in numerous systems. Layered decoding is a technique that can be adopted to reduce the complexity of LDPC decoders. In traditional layered decoders for Quasi-cyclic (QC) LDPC codes, each layer consists of one block row of a parity check matrix associated with the LDPC code. Although a proposed multi-block-row layered decoder has a reduced number of clock cycles, a clock frequency (e.g., a clock period) of the proposed multi-block-row layered decoder is limited due to a long "critical path" (e.g., a longest combinational logical path). Thus, there is a need for an improved multi-block-row layered decoder.

SUMMARY

Techniques are disclosed for performing multi-block-row layered decoding for low density parity check (LDPC) codes. For example, a multi-block-row layered decoder is disclosed that has a substantially shorter "critical path" than previously proposed multi-block-row layered decoders.

DETAILED DESCRIPTION

Particular embodiments of the present disclosure are described below with reference to the drawings. In the description, common features are designated by common reference numbers throughout the drawings.

Figure 1A:
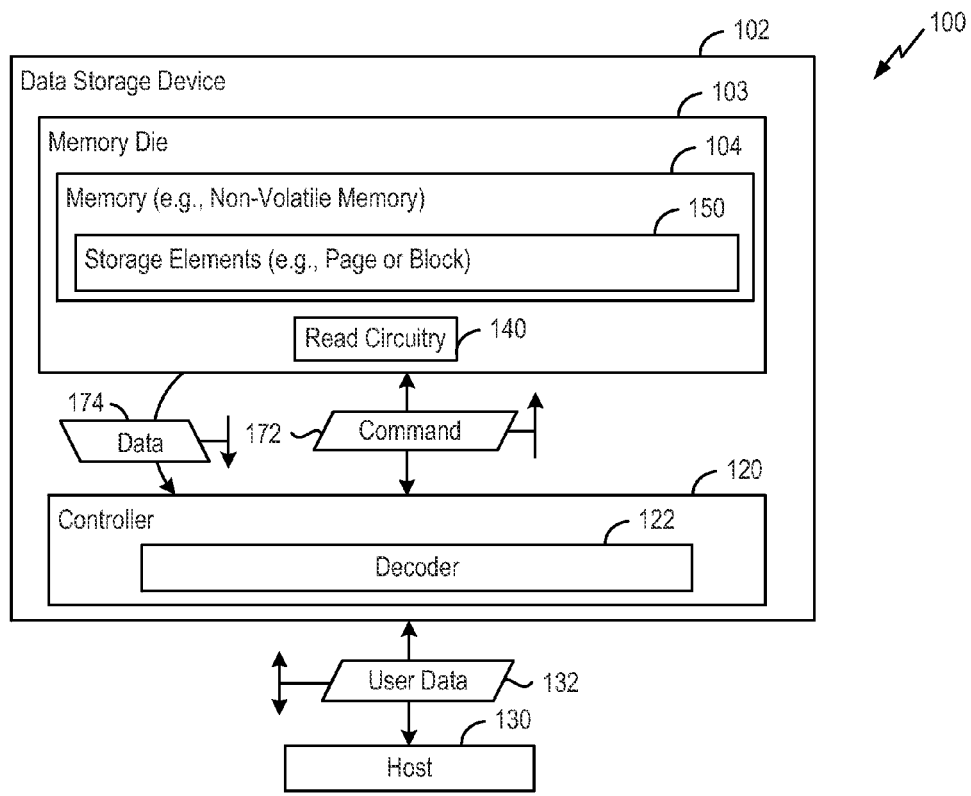
FIG. 1A is a block diagram of a particular illustrative embodiment of a system including a data storage device having a multi-block-row layered decoder for low density parity check (LDPC) codes.

FIG. 1A is a block diagram of a particular illustrative embodiment of a system 100 including a data storage device 102 coupled to an accessing device, such as a host device 130. The data storage device 102 may be coupled to the host device 130 via a communication path, such as a wired communication path and/or a wireless communication path. The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration.

The host device 130 may include a processor and a memory. The memory may be configured to store data and/or instructions that may be executable by the processor. The memory may be a single memory or may include one or more memories, such as one or more non-volatile memories, one or more volatile memories, or a combination thereof. The host device 130 may issue one or more commands to the data storage device 102, such as one or more requests to read data from or write data to a memory 104 of the data storage device 102. For example, the host device 130 may send data, such as user data 132 to be written to the memory 104 of the data storage device 102.

The data storage device 102 includes a controller 120 coupled to the memory 104, such as a non-volatile memory. The controller 120 may be coupled to the memory 104 via a bus, an interface, another structure, or a combination thereof. The memory 104 may include a two dimensional memory configuration or a three dimensional (3D) memory configuration. The memory 104 may store data, such as a representation of the user data 132.

The memory 104 may be included on a memory die 103 that is separate from the controller 120 and coupled to the controller 120 (e.g., via a bus). However, in other implementations, the memory 104 and the controller 120 may be included on a common die. The memory 104 may include multiple blocks each having multiple pages of storage elements. The example of FIG. 1A depicts that the memory 104 includes a plurality of storage elements 150, which may correspond to a block, a page (e.g., a physical page), or a wordline of the memory 104, as illustrative, non-limiting examples. Each storage element (e.g., memory cell or bit cell) of the storage elements 150 may be configured to store a data value (e.g., a bit value), such as "1" and "0." For example, each storage element may be programmable as a single-level cell (SLC) (e.g., a single bit per storage element) or a multi-level cell (MLC) (e.g., multiple bits per storage element).

The memory die 103 may further include read circuitry 140 and write circuitry (not shown) that are configured to enable operations of reading data from the storage elements 150 of the memory 104 and writing data to the storage elements 150 of the memory 104, respectively. The read circuitry 140 and the write circuitry may be separate components of the memory die 103 or may be included in a single component of the memory die 103.

The controller 120 may receive data and commands (e.g., instructions) from the host device 130 and may send data (and commands) to the host device 130. The controller 120 may send data and commands, such as a command 172, to the memory 104 and may receive data from the memory 104. For example, the command 172 sent by the controller 120 to the memory 104 may include one or more write commands to store data to a specified address of the memory 104. A write command may specify a physical address of a portion of the memory 104 (e.g., a physical address of a wordline of the memory 104) that is to store the data. The controller 120 is configured to send one or more read commands to the memory 104 to access data from a specified address of the memory 104. As an example, the command 172 sent by the controller 120 to the memory 104 may include a read command to access a representation (e.g., a codeword) of the user data 132 stored in the memory 104. The read command may specify the physical address of a portion of the memory 104 (e.g., a physical address of a wordline storing the codeword).

The controller 120 may include a decoder 122 configured to receive data read from the memory 104, such as a representation of a codeword that may include one or more errors. The decoder 122 is a multi-block-row layered decoder, as described further herein. For example, the decoder 122 may be a 2-block-row layered decoder, a 3-block-row layered decoder, or a multi-block-row layered decoder configured to process layers that include more than three block rows, as illustrative, non-limiting examples. The decoder 122 may receive the read values from the memory die 103 (e.g., via the read circuitry 140). The decoder 122 may be included in an error correction code (ECC) engine (not shown). The ECC engine may further be configured to encode received data, such as the user data 132, and to generate one or more error correction code (ECC) codewords (e.g., a codeword including a data portion and a parity portion) based on the data. For example, the ECC engine may include an encoder configured to encode the data using an ECC encoding technique. The ECC engine may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The decoder 122 may be configured to decode data read from the memory 104 to detect and correct errors, such as bit errors, that may be present in the data. For example, based on a read command, the read circuitry 140 may send data corresponding to a codeword 174 to the controller 120 (e.g., the decoder 122). The decoder 122 may receive the data 174 (e.g., data that represents a codeword but that includes one or more errors) and perform one or more decoding operations, such as an iterative decoding operation, on the data 174. The decoder 122 may correct a number of errors, such as a number of bit errors, up to an error correction capability of a technique (e.g., an ECC technique) implemented by the decoder 122. A number of errors identified by the decoder 122 (e.g., the ECC engine) may be tracked by the controller 120, such as by the ECC engine. For example, based on the number of errors, the ECC engine may determine an error rate associated with one or more blocks of the memory 104.

The ECC engine (e.g., the decoder 122) may implement error correcting codes, such as low-density parity check (LDPC) codes. A low-density parity-check (LDPC) code may be defined by a parity check matrix H or a corresponding Tanner graph. For example, each row of the parity check matrix H may correspond to a check node and each column may be associated with a variable node in the Tanner graph. A non-zero entry in the parity check matrix H may translate to an edge that connects a corresponding check and variable nodes.

During a decoding process (e.g., an LDPC decoding process) including one or more iterative decoding operations, such as a decoding scheme implemented by the decoder 122, messages associated with (e.g., representing) probabilities that a received symbol equals one or more possible values may be iteratively passed through the edges in the Tanner graph. Each decoding iteration may include at least two stages, a check node processing stage that computes check-to-variable (c2v) messages and a variable node processing stage that updates variable-to-check (v2c) messages. Iterations may be repeated until a codeword is found or until a threshold number of iterations is satisfied (e.g., reached or exceeded).

Figure 1B:
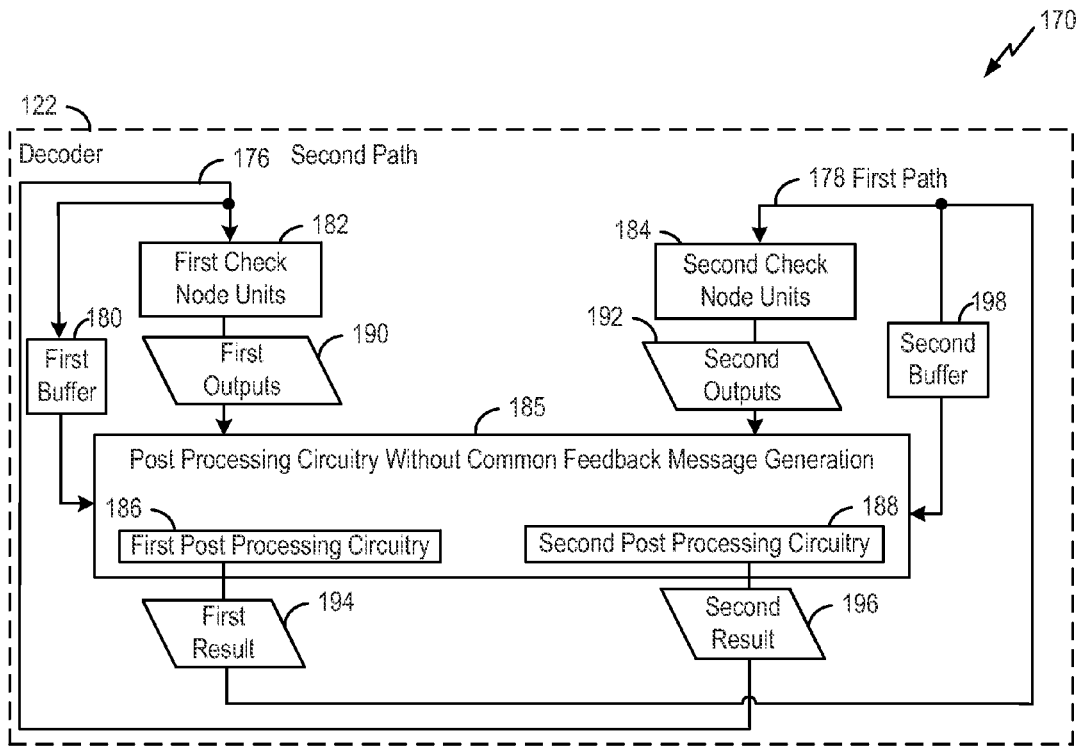
FIG. 1B is a block diagram illustrating a first embodiment of the decoder of FIG. 1A.

Referring to FIG. 1B, an illustrative example of an implementation of the decoder 122 (e.g., a multi-block-row layered decoder) is illustrated at 170. For example, the decoder 122 may be configured to perform an iterative decoding operation on channel information, such as codeword data retrieved from the memory 104. In the implementation depicted at 170, the decoder 122 is a 2-block-row layered decoder.

The decoder 122 may include check node units (CNUs) 182, 184, buffers 180, 198, and post processing circuitry 185. The post processing circuitry 185 may not be configured to generate a common feedback message. In traditional decoders, all check node unit (CNU) inputs for a next iteration are derived from a single value that is computed during a current iteration. This single value is referred to herein as a "common feedback message." An example of a common feedback message is the intrinsic message L that is described further with reference to equation (2). The post processing circuitry 185 may include first post processing circuitry 186 and second post processing circuitry 188. The check node units (CNUs) 182, 184 may be associated with the check node processing stage that computes the c2v messages and the post processing circuitry 185 may be associated with the variable node processing stage that updates the v2c messages. For example, the first post processing circuitry 186 may be configured to calculate updated v2c messages for the second check node units (CNUs) 184 and the second post processing circuitry 188 may be configured to calculate updated v2c messages for the first check node units (CNUs) 182. Although the first post processing circuitry 186 and the second post processing circuitry 188 are depicted as separate circuitry, one or more components may be common to both the first post processing circuitry 186 and the second post processing circuitry 188.

During an iteration of the multi-block-row layered decoding, first check node units (CNUs) 182 and a first buffer 180 may receive first inputs. The first check node units (CNUs) 182 may generate first outputs 190 that are provided to the post processing circuitry 185. For example, the first check node units (CNUs) 182 may generate the first outputs 190 based on the first inputs. The first buffer 180 may buffer the first inputs and provide the first inputs to the post processing circuitry 185. Also during the iteration (e.g., in parallel with the first check node units 184), second check node units (CNUs) 184 and a second buffer 198 may receive second inputs. The second check node units (CNUs) 184 may generate and provide second outputs 192 to the post processing circuitry 185. The second buffer 198 may buffer the second inputs and provide the second inputs to the post processing circuitry 185. Although the first buffer 180 and the second buffer 198 are illustrated as being external to the post processing circuitry 185, in other embodiments the first buffer 180 and/or the second buffer 198 may be included in the post processing circuitry 185.

The first post processing circuitry 186 may generate the first results 194 based on the first outputs 190, the second outputs 192, the second inputs (e.g., buffered second inputs), or a combination thereof. The first post processing circuitry 186 may provide the first results 194 to the second check node units 184, via a first path 178, for use by the second check node units 184 during a next iteration (e.g., a next sequential iteration). The first path 178 may include one or more components of the first post processing circuitry 186. For example, the first path 178 may be associated with a "critical path" of the decoder 122. The second post processing circuitry 188 may generate the second results 196 based on the first outputs 190, the second outputs 192, the first inputs (e.g., buffered first inputs), or a combination thereof. The second post processing circuitry 188 may provide the second results 196 to the first check node units (CNUs) 182, via the second path 176, for use by the first check node units 182 during the next iteration. The second path 176 may include one or more components of the second post processing circuitry 188. For example, the second path 176 may be associated with a "critical path" of the decoder 122. The first path 178 is distinct from the second path 176. During a next iteration, the first results 194 may be used by the second check node units (CNUs) 184 and the second results 196 may be used by the first check node units (CNUs) 182.

An example of a "critical path" (e.g., the longest combinational logical path) in the decoder 122 may start in the first check node units (CNUs) 182, go through the post processing circuitry 185 (e.g., the first post processing circuitry 186), and may end at the second check node units (CNUs) 184. Another example of a "critical path" of the decoder 122 may start in the second check node units (CNUs) 184, go through the post processing circuitry 185 (e.g., the second post processing circuitry 188), and may end at the first check node units (CNUs) 182. A "critical path" of the decoder 122 may be shorter than a "critical path" of multi-block-row layered decoders according to other approaches. An example of the decoder 122 (e.g., the multi-block-row layered decoder with two block-rows in each layer) is shown with respect to FIG. 2A.

During operation of the data storage device 102, the controller 120 may receive the user data 132 from the host device 130 to be written to the memory 104. The controller 120 may send the command 172 that includes a write command to the memory die 103. The write command may command the memory 104 to write the user data 132 (or an encoded version (e.g., a codeword) of the user data 132) into a particular location in the memory 104, such as a location that may correspond to one or more of the storage elements 150.

After the user data 132 is written to the memory 104, the controller 120 may receive a read command from the host device 130. The controller 120 may send another command 172 that includes a read command. Based on the read command, the read circuitry 140 may perform a read operation on the memory 104 and provide a read value to the controller 120 (e.g., the decoder 122).

The decoder 122 may receive the read values (e.g., the data 174) and may perform an iterative decoding operation until a valid codeword is determined or until a threshold number of iterations is satisfied (e.g., reached or exceeded). For example, during a particular iteration of the iterative decoding operation, the decoder 122 may process a first block row of a layer of a parity check matrix H (e.g., associated with QC-LDPC codes) to generate the first outputs 190. For example, the first block row may be an even row of the layer that is processed by the first check node units (CNUs) 182. During the particular iteration, the decoder 122 may simultaneously process a second block row of the layer of the parity check matrix H to generate the second outputs 192. For example, the second block row may be an odd row of the layer that is processed by the second check node units (CNUs) 184. Additionally, during the particular iteration, the decoder 122 may perform first processing of the first outputs 190 to generate the first results 194 based on a first computation and perform second processing of the second outputs 192 to generate the second results 196 based on a second computation. The first results 194 and the second results 196 are for different block-rows of the parity check matrix H.

If a codeword is determined based on the iterative decoding operation, the decoder 122 may output the codeword, such as a data portion of the codeword and a parity portion of the codeword. If the decoder 122 is unable to converge on (e.g., determine) a codeword based on the iterative decoding operation, the decoder may generate a flag indicating uncorrectable errors. Although the decoder 122 has been illustrated and described with reference to data storage device 102 of FIG. 1A, the decoder 122 may be included in devices and/or systems other than data storage device. For example, the decoder 122 may be included in communication devices and/or communication systems, such as devices and systems using optical communication, digital communication, etc. To illustrate, when the decoder 122 is included in a communication device, the communication device may receive channel information (e.g., channel data) that is provided as an input to the decoder 122.

By using the distinct paths 176 and 178 to provide the results 194 and 196 to the respective check node units 182 and 184, a "critical path" length may be reduced as compared to implementations that include logic that performs more extensive computations to compute a common feedback message, such as a common intrinsic message L, as described further herein. As a result, a decoder clock frequency and a decoding throughput of the decoder 122 may be increased.

Figure 2A:
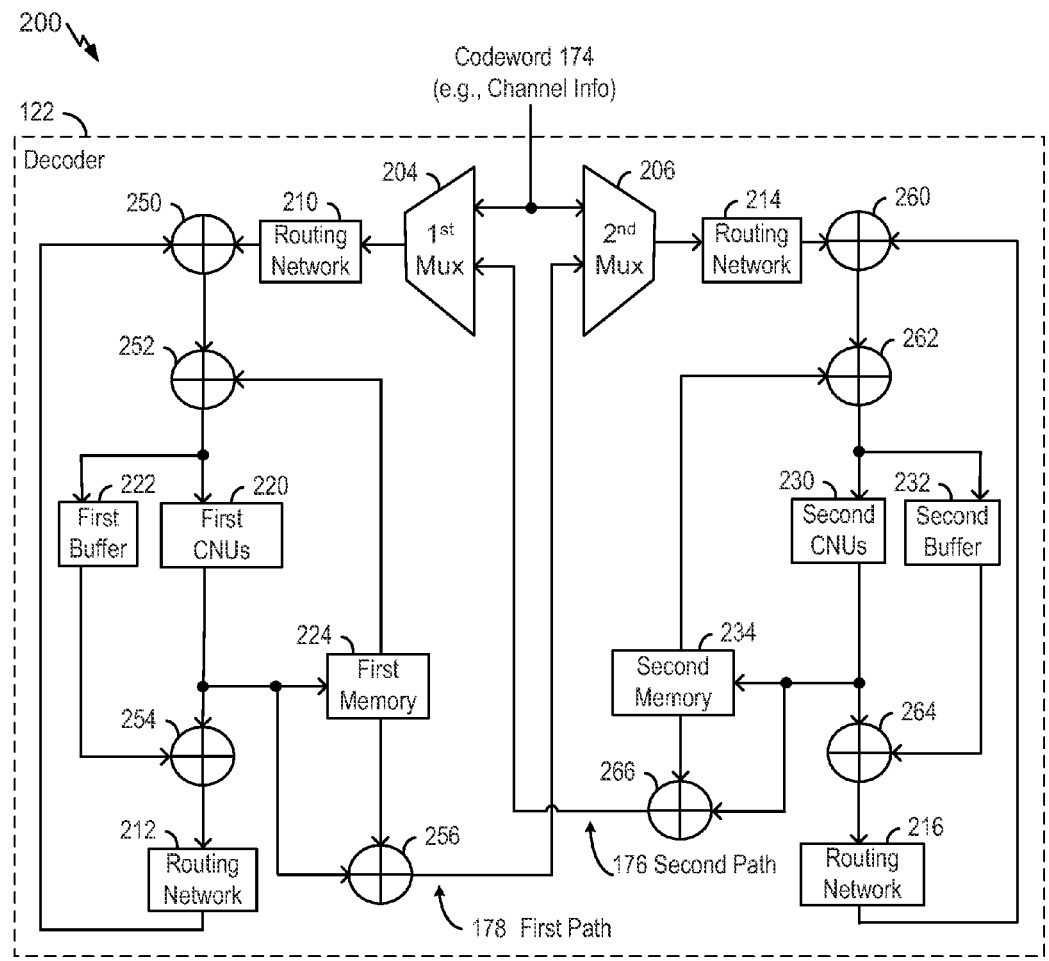
FIG. 2A is a block diagram illustrating a second embodiment of the decoder of FIG. 1A.

Referring to FIG. 2A, a particular illustrative embodiment of the decoder 122 of FIG. 1A is depicted and designated 200. As depicted, the decoder 122 may be a 2-block-row layered decoder.

The decoder 122 may include multiplexors 204, 206, check node units (CNUs) 220, 230, buffers 222, 232, memories 224, 234, routing networks 210, 212, 214, 216, and adding circuits 250, 252, 254, 256, 260, 262, 264, 266. For example, first check node units 220 and second check node units (CNUs) 230 may include or correspond to the first check node units 182 and the second check node units (CNUs) 184 of FIG. 1B, respectively. The buffers 222, 232 may include or correspond to the first buffer 180 and the second buffer 198 of FIG. 1B, respectively. In FIG. 2A, each of the adding circuits 250, 252, 254, 256, 260, 262, 264, 266 may represent a group of adders configured in parallel. Additionally, each of the routing networks 210, 212, 214, 216 may represent a group of routers configured in parallel. Each of the multiplexors 204, 206 may represent a group of multiplexors configured in parallel.

Although the memories 224, 234 are illustrated as two distinct memories, the memories 224, 234 may be included in a single memory, such as static random access memory (SRAM). Additionally, although the memories 224, 234 are illustrated as being distinct from the check node units 220, 230, the first memory 224 may be included in the first check node units 220 and/or the second memory 234 may be included in the second check node units 230. Additionally or alternatively, although the buffers 222, 232 are illustrated as two distinct buffers, the buffers 222, 232 may be included in a single buffer. Although not illustrated, the decoder 122 may include or be coupled to control logic configured to provide one or more control signals to the multiplexors 204, 206 to enable each the multiplexors 204, 206 to select an output from different received inputs.

One or more of the components of the decoder 122 as illustrated in FIG. 2A may be included in post processing circuitry, such as the post processing circuitry 185 FIG. 1B. For example, the first post processing circuitry 186 of FIG. 1B may include or correspond to one or more components that contribute to generating updated v2c messages for the second check node units (CNUs) 230. The second post processing circuitry 188 of FIG. 1B may include or correspond to one or more components that contribute to generating updated v2c messages for the first check node units (CNUs) 220.

Although different decoding techniques of LDPC codes may include various check node processing schemes, each of the decoding techniques of LDPC codes may share the same variable node processing scheme. To illustrate, let $(\gamma_n)$ be the information from a channel (e.g., a representation of a codeword read from the memory 104) for a variable node n. Additionally, the v2c messages from variable node n to check node m in iteration j may be denoted by $u_{m,n}^{(j)}$, and the c2v messages from check node m to variable node n in iteration j−1 may be denoted by $v_{m,n}^{(j-1)}$. Further, let $S_c(n)$ denote a set of check nodes connected to variable node n. Accordingly, the variable node processing scheme computes:

$$u_{m,n}^{(j)} = \gamma_n + \sum_{i \in S_c(n) \setminus m} v_{i,n}^{(j-1)}.$$

For a quasi-cyclic (QC)-LDPC code, the parity check matrix H may include multiple square sub-matrixes. Each of the multiple square sub-matrixes may be a zero matrix or may be non-zero matrix, such as a cyclically-shifted matrix (e.g., a cyclically-shifted identity matrix that includes non-zero entries on a cyclically-shifted diagonal). Since the cyclically-shifted identity matrix includes one non-zero entry in each row and/or column of the non-zero sub-matrix, QC-LDPC codes may enable more efficient hardware implementations than other LDPC codes.

There are many decoding techniques (e g, many decoding schemes) associated with LDPC codes and/or LDPC decoders that may be implemented by a decoder in digital communication and storage systems, such as the decoder 122 of the data storage device 102. For example, layered decoding is a technique that can be used to reduce the complexity of an LDPC decoder. In layered decoding, the parity check matrix H may be divided into blocks of rows, also called layers. Instead of updating the v2c messages once in each iteration as in traditional decoding schemes, the c2v messages derived from the decoding of a layer using layer decoding may be used to update the v2c messages to be used in the decoding of the next layer. Accordingly, the v2c messages may be updated multiple times within each iteration. Since the v2c messages get updated more often, the layer decoding converges faster and hence takes fewer iterations to finish the decoding process than the traditional decoding schemes.

Conventionally, in the layered decoding of QC-LDPC codes, each layer includes one block row of sub-matrixes of the parity check matrix H. In this case, there is at most one c2v message for each variable node during the decoding of a layer. To illustrate, the v2c and c2v messages for block row/in decoding iteration j may be denoted by $u^{(j,l)}$ and $v^{(j,l)}$, respectively. It is noted that the variable and check node indexes, m and n, are omitted from these notations for brevity and ease of explanation. Accordingly, the v2c messages for one-block-row layered decoding can be generated as:

$$u^{(j,l+1)} = (u^{(j,l)} + v^{(j,l)}) - v^{(j-1,l+1)}. \tag{1}$$

Channel information (e.g., the codeword data 174, read from the memory 104) may be used as the v2c messages for an initial layer in the first decoding iteration for the first layer. After the first decoding iteration, the channel information may be incorporated in updated v2c messages and hence does not need to be stored. Additionally, the layered decoding may only record (e.g., store or buffer) the v2c messages for one layer instead of for the entire parity check matrix H. Thus, layered decoders not only have shorter latency and lower power consumption because of the faster convergence, but also a smaller memory requirement.

Various limitations may be present (e.g., inherent) when using the layer decoding scheme (e.g., a layer decoder). Due to the data dependency, the decoding of the next layer cannot start until that of a current layer is completed. This means that only one block row is decoded at a time. Therefore, the number of clock cycles needed for each decoding iteration is proportional to the number of block rows in the parity check matrix H. For example, if the H matrix has four block rows (each row including square matrixes that are a cyclically shifted identity matrix), the number of clock cycles for a decoding iteration may be equal to four times the number of clock cycles to process each block row. Because of the clock cycle limitation of the traditional layered decoding schemes (e.g., traditional layered decoders that process a single block row at a time), decoding speeds fast enough to achieve a target data throughput rate may not be achievable.

To achieve increased speed (e.g., a higher throughput) as compared to the traditional layered decoding schemes (e.g., traditional the layered decoder that processes a single block row at a time), multiple block rows may be included in a layer to be processed. In the case of processing multiple block rows in a layer, updating of a v2c message would depend on multiple c2v messages, which may be considered as a non-trivial extension from equation (1).

In contrast to the architecture depicted in FIG. 2A, another approach to implement a multi-block-row layered decoding scheme (referred to herein as a "first approach") includes an intrinsic message L used to compute the v2c messages. The intrinsic message L may be initialized based on received channel information and may be updated with each iteration of the multi-block-row layered decoding scheme according to the first approach. For example, assume that each layer consists of p block rows of the parity check matrix H. To derive $u^{(j,pi+k)}$ for k=0, 1, ..., p−1, the intrinsic message L may be updated as:

$$L \Leftarrow L + \sum_{k=0}^{p-1} (v^{(j,p(i-1)+k)} - v^{(j-1,p(i-1)+k)}). \tag{2}$$

Accordingly, the v2c messages are computed as:

$$u^{(j,pi+k)} = L - v^{(j-1,pi+k)}. \tag{3}$$

Because the message L includes the contribution from every check node, and the c2v message from a check node from the previous iteration is subtracted from the message L to generate the v2c message, the message L is referred to herein as an "intrinsic" message.

For an example case, of p=2, a 2-block-row layered decoder according to the first approach may include two groups of check node units (CNUs) to implement the check node processing for even and odd block rows. For example, first check node units (CNUs) may perform check node processing for even block rows and second check node units (CNUs) may perform check nod processing for odd rows. Since the non-zero entries may appear at different locations in each sub-matrix, routing networks may be used to send the v2c messages to the correct CNUs. The computed c2v messages may be stored in a memory to be used in computations of the v2c messages for subsequent layers. To illustrate, when the 2-block-row layered decoder according to the first approach implements a binary LDPC decoding technique, such as a min-sum technique, a pair of min1 and min2 values and an index value for min1 may be found (e.g., calculated) for each check node. Multiplexors may be used to recover the c2v messages from a check node based on the corresponding min1 and min2 values, the index value for min1, and the index value of the variable node. Hence, the min1 and min2 values can be stored (e.g., in a memory) as compressed c2v messages. Additionally, each pair of messages involved in the subtraction in equation (2) may be c2v messages of the same row but different iterations. Hence, no reverse routing is needed before the subtraction is carried out. Similarly, no permutation may be necessary on $v^{(j-1,pi+k)}$ to compute $u^{(j,pi+k)}$ in equation (3) as long as the intrinsic messages L are routed according to block row pi+k. Nevertheless, because the v2c messages have been permuted differently for different block rows, reverse routing may be used to align the c2v messages for the same variable node before the differences for different k in equation (2) are added up.

A minimum achievable clock period of the 2-block-row layered decoder based on equations (2)-(3) may be associated with a "critical path" defined as a longest combinational logic data path. The longer the "critical path", the longer the minimum achievable clock period. The 2-block-row layered decoder according to a first approach based on equations (2)-(3) may have a "critical path" that begins and ends in one of the check node units (CNUs). For example, a "critical path" may begin from the output of a register inside the check node units (CNUs)) and may pass through first adding circuits (e.g., a group of adders, such as multiple adder circuits), first routing networks (e.g., a group of routing networks), second adding circuits, third adding circuits, multiplexors (e.g., a group of multiplexors), second routing networks, and fourth adding circuits before ending back at the check node units (CNUs). A "critical path" includes components to generate the common feedback message L. Accordingly, a "critical path" of the 2-block-row layered decoder according to the first approach may include four adding circuits and two routing networks. This long "critical path" of the 2-block-row layered decoder according to the first approach may limit the achievable clock frequency of the 2-block-row layered decoder. Thus, while the multi-block-row layered decoder (e.g., the multi-block-row layered decoding scheme) according to the first approach reduced the number of clock cycles as compared to the traditional layer decoder (e.g., the traditional layered decoding scheme that processes a single block row at a time), the clock period of the multi-block-row layered decoding scheme is much longer, based on a "critical path", as compared to the one-block row layered decoding scheme.

In contrast to the 2-block-row layered decoder of the first approach based on equations (2)-(3), the decoder 122 illustrated in FIG. 2A may correspond to a "second approach" based on equation (4), below, and represents a modification of how the v2c messages are updated, as compared to of the multi-block-row layered decoder according to the first approach. By modifying how the v2c messages are updated, the multi-block-row layered decoder according to the second approach may achieve a shorter "critical path" than the multi-block-row layered decoder according to the first approach, and hence achieves a higher clock frequency than the multi-block-row layered decoder according to the first approach, as described further herein.

By keeping track of the most recently updated c2v messages and which c2v messages should contribute to the v2c messages, the v2c messages can be updated instead as:

$$u^{(j,pi+k)} = (u^{(j,p(i-1)+k)} - v^{(j,p(i-1)+k)}) + \sum_{l=0,l\neq k}^{p-1} (v^{(j,p(i-1)+l)} - v^{(j-1,p(i-1)+l)}) - v^{(j-1,pi+k)} \quad (4)$$

for k=0, 1, . . . , p−1. The subtractions for each pair of messages in equation (4) can be carried out in parallel. After that, p−1 additions and one subtraction may be used to derive $u^{(j,pi+k)}$. The subtractions of the message pairs in equation (2) can also be performed simultaneously. Nevertheless, p additions and one subtraction are performed after the subtraction in equations (2) and (3). As a result, the v2c message updating according to equation (4) (e.g., a two-block-row layered decoder according to the second approach) has one less adder (e.g., one less group of adding circuits) in a "critical path" (e.g., as compared to the two-block-row layered decoder according to the first approach). Similar to those in equation (2), each pair of messages involved in the subtractions in equation (4) belong to the same block row of the parity check matrix H. Hence, routing or reverse networks is not needed to carry out these subtractions. In addition, the multi-block-row layered decoding scheme according to the second approach may not use a "common" message, such as the intrinsic message L in equation (2), that is to be shared in the updating of different v2c messages. This enables the reverse message routing of the current layer to be combined with the message routing for the next layer when the multi-block-row layered decoding scheme according to the second approach is used. Thus, the number of routing networks in a "critical path" of the multi-block-row layered decoder according to the second approach is also reduced as compared to the multi-block-row layered decoder according to the first approach. Although the multi-block-row layered decoder according to the second approach has been described with reference to the min-sum technique for binary LDPC codes, it is understood that the multi-block-row layered decoder according to the second approach may be applied to non-binary LDPC decoding or other binary LDPC decoding techniques (e.g., techniques other than the min-sum technique).

Referring to the equation (4), an architecture of the decoder 122 (e.g., the multi-block-row layered decoder) may be illustrative of the case of p=2, where the first and second block rows in a layer are denoted by even and odd rows, respectively. Accordingly, the equation (4) can be simplified as:

$$\begin{cases} u^{(j,even)} = (u^{(j,even-2)} - v^{(j,even-2)}) + (v^{(j,odd-2)} - v^{(j-1,odd-2)}) - v^{(j-1,even)} \\ u^{(j,odd)} = (u^{(j,odd-2)} - v^{(j,odd-2)}) + (v^{(j,even-2)} - v^{(j-1,even-2)}) - v^{(j-1,odd)} \end{cases} \quad (5)$$

The inputs to the CNUs, $u^{(j,even-2)}$ and $u^{(j,odd-2)}$ may be held in the buffers 222, and 232 until the inputs are consumed in the subtractions at the outputs of the CNUs 220, 230. For example, the outputs of the CNUs 220, 230 may include or correspond to the outputs 190, 192 of FIG. 1B. Similarly, min1 and min2 values computed by the CNUs 182, 184 may be stored as compressed c2v messages in the memories 224, 234 to be used for the decoding of later layers. The differences of the four pairs of messages in the equation (5) may be computed by the four adding circuits 254, 256, 264, 266. The differences may be permutated to align with each other before they are added up, and four routing networks 210, 212, 214, 216 may satisfy this purpose. However, the four routing networks 210, 212, 214, 216 may not generate c2v messages for variable nodes in the order 0, 1, 2, 3, . . . , etc. Instead, the messages may be permuted according to locations of the non-zero entries in block row even and odd. In this case, no additional routing may be performed for aligning the messages in the rest of the computations in the equation (5). It can be understood that the four routing networks 210, 212, 214, 216 implement combined functions of reverse routing for block row even−2 and odd−2 and routing for block row even and odd. Combining routing functions may not cause any additional hardware overhead to be included in the decoder 122. The channel information 202 (e.g., data corresponding to a possibly corrupted codeword, such as the data 174 of FIG. 1A) may be used as the v2c message for the first layer in the first decoding iteration. Routing of the channel information 202 for the first layer may be performed by sharing existing networks. After decoding of the first layer in the first iteration, control signals may be provided to the multiplexors 204, 206 to cause outputs of the adding circuits 256, 266 to be provided along feedback paths to the first check node units (CNUs) 220 and the second check node units (CNUs) 230, respectively. Although an architecture of the decoder 122 as a two-block-row layer decoder has been described and illustrated in accordance with the equation (4), one of skill in the art will realize that the equation (4) may be applied to architectures of other multi-block-row layered decoders that process more than two-block-rows per layer.

A "critical path" of the decoder 122 may be understood with reference to the first check node units (CNUs) 220. A "critical path" may start at an output of a register inside the first check node units (CNUs) 220, go through the adding circuits 256, go through the second multiplexors 206, go through the routing networks 214, go through the adding circuits 260 and 262, and end in the second check node units (CNUs) 230. Compared to a 2-block-row layered decoder according to the first approach, as described above, which includes two routing networks and four adding circuits in its "critical path" according to the first approach, the decoder 122 (e.g., a 2-block-row layered decoder according to the second approach) may include one less group of adding circuits and one less group of routing networks in a "critical path" of the decoder 122. For example, a "critical path" of a 2-block-row layered decoder according to the second approach may include less than two routing networks, less than four adding circuits, or a combination thereof. To illustrate, a "critical path" of a 2-block-row layered decoder according to the second approach may include one routing network (e.g., the routing network 214) and three adding circuits (e.g., the adding circuits 256, 26, 262), as an illustrative, non-limiting example.

Figure 2B:
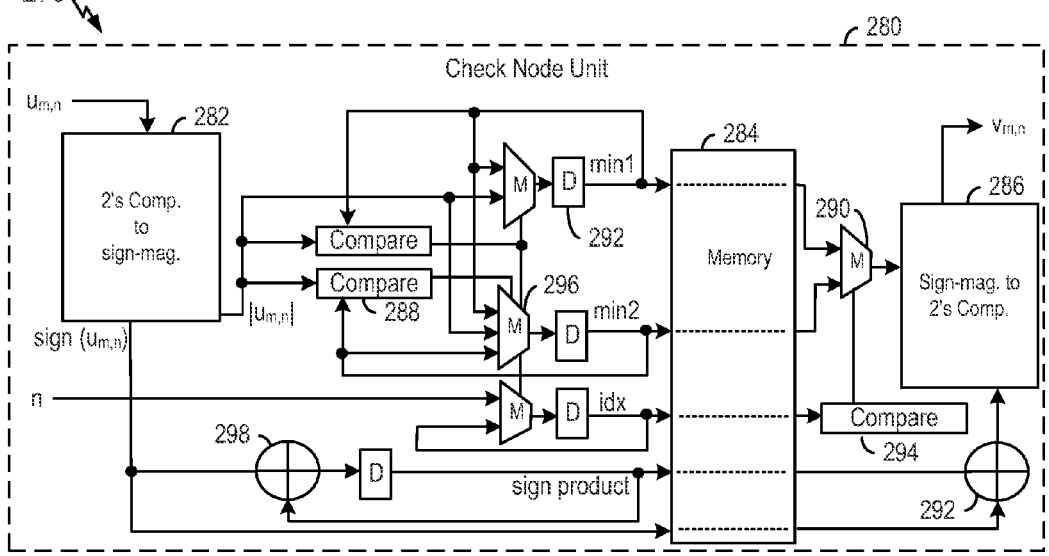
FIG. 2B is a block diagram illustrating a check node unit of the decoder of FIG. 1A.

Referring to FIG. 2B, an example of an illustrative check node unit (CNU) 280 is illustrated at 270. The check node unit (CNU) may be included in the decoder 122, such as in the first check node units (CNUs) 182, the second check node units (CNUs) 184 of FIG. 1B, the first check node units (CNUs) 220, or the second check node units (CNUs) 230 of FIG. 2A. As described herein, an architecture of the check node unit (CNU) 280 is associated with a Min-sum decoder; however, other architectures of the check node unit (CNU) 280 may be possible for use with other types of decoders.

The check node unit (CNU) 280 may be included in a plurality of check node units. For example, the check node unit (CNU) 280 may correspond to a check node that has an index m. The check node unit (CNU) 280 may be configured to find the minimum (min1) and second minimum (min2) magnitudes, the index of the minimum magnitude (idx), and the sign product of all $u_{m,n}$ with $n \in S_v(m)$. Here $S_v(m)$ is the set of all variable nodes connected to check node m. For example, the check node unit (CNU) 280 may receive an input that includes a $u_{m,n}$ and an index value n. The check node unit (CNU) 280 may include one or more components to generate min1, min2, idx, the sign product, a sign of $u_{m,n}$, or a combination thereof, as illustrative, non-limiting examples. For example, the one or more components may include components such as a 2's complement to sign-magnitude representation converter 282, one or more comparator circuits (such a representative comparator circuit 288), one or more multiplexors (such as a representative multiplexor 296), one or more delay units (such as a representative delay unit D 292), an adding circuit (such as a representative adding circuit 298 that be an exclusive OR (XOR) circuit), or a combination thereof, as illustrative, non-limiting examples. The 2's complement to sign-magnitude representation converter 282 may be configured to receive $u_{m,n}$ and to output the sign of $u_{m,n}$ (sign($u_{m,n}$)) and the magnitude of $u_{m,n}$ ($|u_{m,n}|$). The one or more components may be configured as illustrated in FIG. 2B.

The check node unit (CNU) 280 may also include a memory 284, such as one of the memories 224, 234 of FIG. 2A, configured to store min1, min2, idx, the sign product, a sign of $u_{m,n}$, or a combination thereof. For example, the values (e.g., min1, min2, and idx) and the sign of each $u_{m,n}$ can be stored as compressed c2v messages to reduce the memory requirement of the memory 284.

The values min1 and min2 may be provided to a multiplexor 290, idx may be provided to a comparator 294, and the sign product and the sign of $u_{m,n}$ may be provided to an adding circuit 292 (e.g., an XOR). When n≠idx, $|v_{m,n}|$ equals min1; otherwise, $|v_{m,n}|$ equals min2. Additionally, the sign of $v_{m,n}$ is an exclusive OR (XOR) of the sign product and the sign of $u_{m,n}$. An output of the multiplexor 290 and an output of the adding circuit 292 are provided to a sign-magnitude representation to 2's complement converter 286. The sign-magnitude representation to 2's complement converter 286 may output $v_{m,n}$.

To provide a quantitative comparison on the "critical paths" of the multi-block-row layered decoder according to the first approach and the multi-block-row layered decoder according to the second approach (e.g., the decoder 122 of FIG. 1A), the "critical paths" of the adding circuits and routing networks may be analyzed. Using a ripple-carry architecture, a w-bit adder may be implemented by w full adders concatenated serially. Each full adder may include 2 logic gates in the data path. Hence, a "critical path" of a w-bit adder has 2w logic gates. Moreover, the addition can start when the least significant bits of the operands are available, and does not have to wait until all bits are ready. Therefore, if the output of an adder is used by another as an input, the second adder only causes 2 extra logic gates to the overall "critical path". It may be assumed that the dimension of the sub-matrixes of the parity check matrix H is e×e, and one block column is processed at a time during the processing of a layer. Accordingly, a routing network for a block row may include e copies of e-to-1 multiplexors, and a "critical path" may have $\log_2$ e logic gates. Additionally, the reverse routing may be implemented by the same architecture. As an illustrative, non-limiting example, assume that w=5 and e=128. A "critical path" of the multi-block-row layered decoder according to the second approach, such as the decoder 122, has $2w+2\times2+\log_2 e+1=22$ gates, while that of the multi-block-row layered decoder according to the first approach has $2w+2\times3+2 \log_2 e+1=31$ gates. Accordingly, the multi-block-row layered decoder according to the second approach, based on the above example, is estimated to be able to achieve a 30% higher clock frequency than the multi-block-row layered decoder according to the first approach. Additionally, it may be understood that the increase in clock frequency may result based on the elimination of one group of adding circuits and one group of routing networks included in a "critical path" of the multi-block-row layered decoder according to the second approach, which may cause a small increase in the area requirement of the multi-block-row layered decoder according to the second approach as compared to the multi-block-row layered decoder according to the first approach. However, such an increase in the area requirement may be acceptable based on (e.g., outweighed by) the benefit in increased processing speed. Although the decoder 122 was explained by using the min-sum technique for binary LDPC codes, the decoder 122 can also be applied to non-binary LDPC decoding or other binary LDPC decoding techniques (e.g., techniques other than the min-sum technique).

By reformulating the v2c message updating equation, fewer messages may be added up to derive each v2c message, and hence a "critical path" of the decoder 122 is reduced as compared to the multi-block-row layered decoder according to the first approach. Based on the decoder 122 being configured according to the equation (4), the decoder 122 may be able to achieve a higher clock frequency as compared to the multi-block-row layered decoder according to the first approach.

Figure 3:
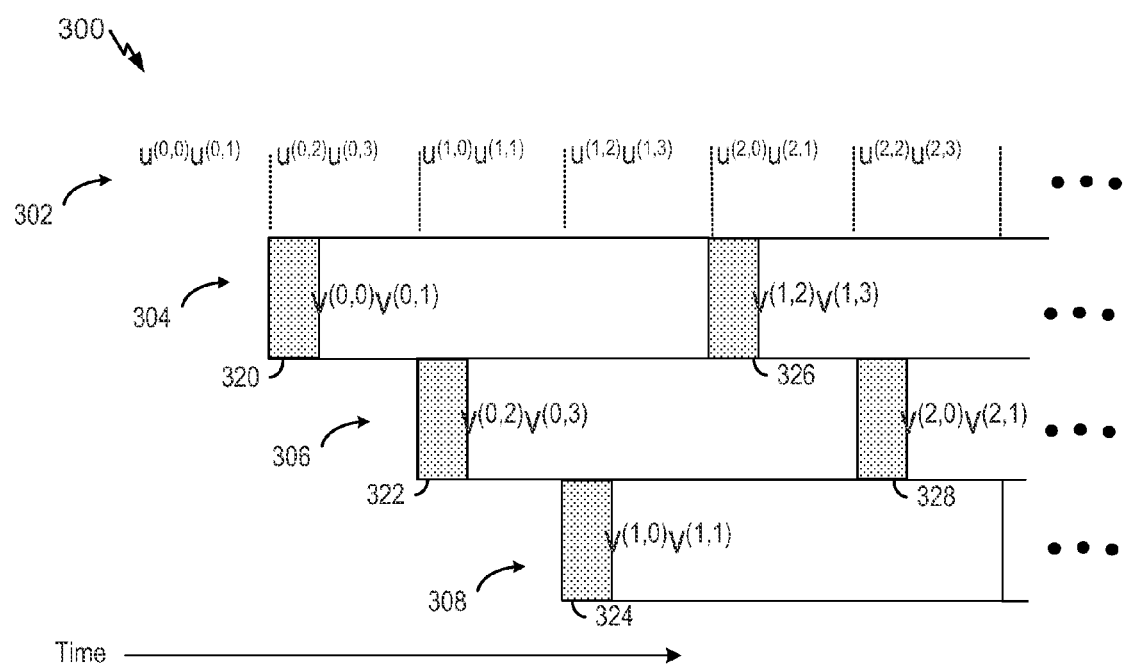
FIG. 3 is a timing diagram illustrating messages stored in a memory inside the decoder of FIG. 1A.

Referring to FIG. 3, a particular illustrative embodiment of a timing diagram is depicted and designated 300. The timing diagram 300 illustrates messages stored in a memory of a decoder, such as in the decoder 122 of FIG. 1A. For example, the memory may include or correspond to the memory 224, 234 of FIG. 2A.

As explained above, the multi-block-row layered decoder according to the second approach (e.g., the decoder 122 of FIG. 1A) may have a larger silicon area than the multi-block-row layered decoder according to the first approach. For example, the decoder 122 of FIG. 2A may have two more adding circuits and one more buffer than the multi-block-row layered decoder according to the first approach. Accordingly, the size of the memory (e.g., a size of the memories 224, 234 of FIG. 2A) for storing the c2v messages may be analyzed. For example, taking an LDPC code whose parity check matrix H is divided into two layers and where each layer has p=2 block rows, the c2v messages are stored during the decoding process of the multi-block-row layered decoder according to the second approach (e.g., decoder 122 as illustrated in FIG. 2A) as shown in FIG. 3. Assuming the min-sum decoding technique is employed, the min1 and min2 values may be stored as compressed c2v messages. One block column may be processed at a time during the decoding of each layer. After the v2c messages for a layer are input block column after block column to the check node units (CNUs), such as the check node units (CNUs) 190, 192 of FIG. 1B or the check node units (CNUs) 220, 230 of FIG. 2A, the min1 and min2 values may be derived and written to the memory (e.g., the memories 224, 234 of FIG. 2A). Values stored in the memory are illustrated based on rows 302, 304, 306, 308 of FIG. 3. The thin dark bars 320, 322, 324, 326, 328 in FIG. 3 may denote time instances at which corresponding values are written to the memory. The values may be held in the memory, as indicated by each of the rows 302, 304, 306, 308, until no longer needed for use in one or more computations.

From FIG. 3, it can be observed that a c2v message is used in the decoding of the next three layers. Therefore, the memory may be able to store the c2v messages for three layers. If the total number of layers is r, then the memory holds the c2v messages for r+1 layers. Using similar analysis, it can be derived that the size of the memory required by the multi-block-row layered decoder according to the first approach is the same. Therefore, there is no additional memory overhead of the multi-block-row layered decoder according to the second approach as compared to the multi-block-row layered decoder according to the first approach.

Figure 4:
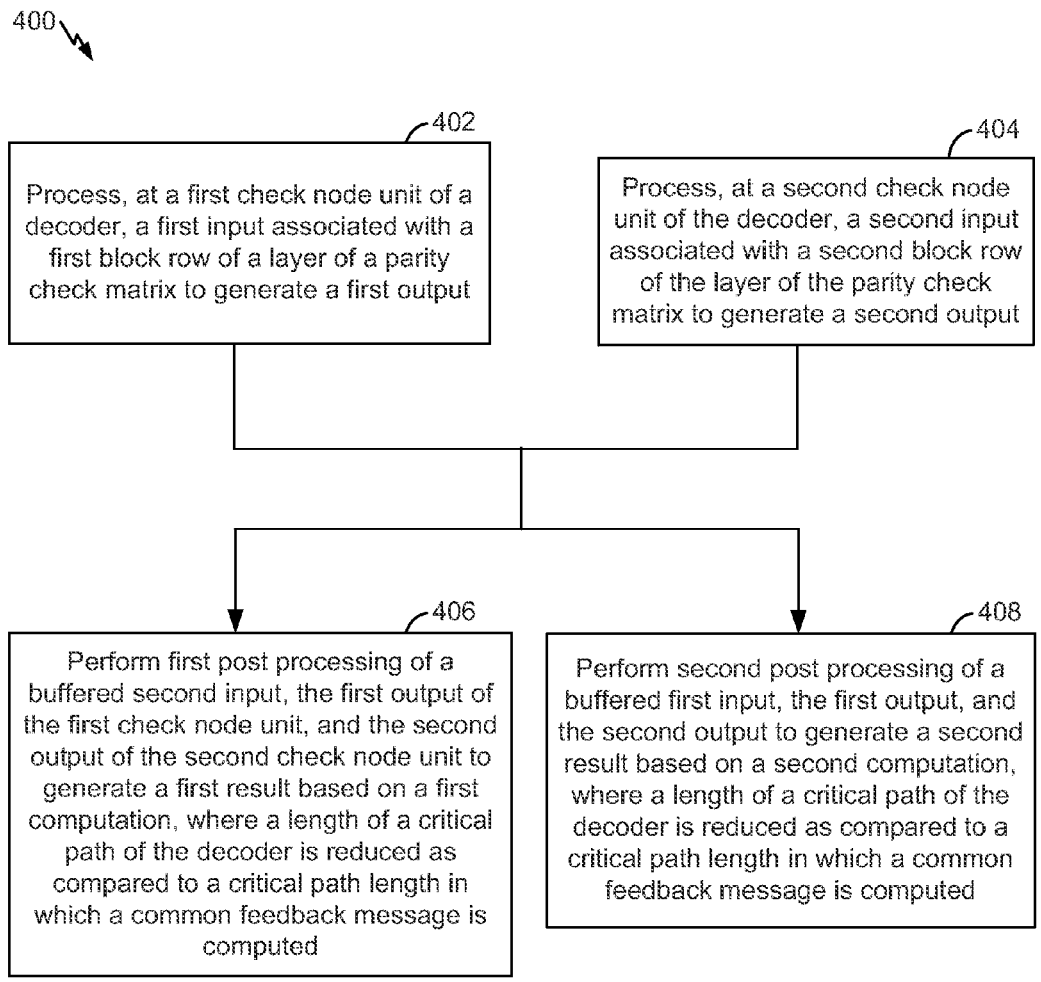
FIG. 4 is a flow diagram of an illustrative method of performing multi-block-row layered decoding.

Referring to FIG. 4, an illustrative embodiment of a method 400 of performing multi-block-row layered decoding is shown. For example, the method 400 may be performed by a decoder, such as the decoder 122 of the data storage device 102 of FIG. 1A.

The method 400 includes processing, at a first check node unit of the decoder, a first input associated with a first block row of a layer of a parity check matrix to generate a first output, at 402. The first input received by the first check node unit may be stored at a first buffer coupled to the first check node unit. The first buffer, such as the first buffer 222 of FIG. 2A, may store the first input during processing of the first input by the first check node unit. The first check node unit may be included in the first check node units (CNUs) 182 of FIG. 1B or the first check node units (CNUs) 220 of FIG. 2A. The first output generated by the first check node unit may be included in the first outputs 190 of FIG. 1B or an output of the first check node units (CNUs) 220 of FIG. 2A. The first output may be provided to one or more components of the decoder, such as the first post processing circuitry 186, the second post processing circuitry 192 of FIG. 1B, the first memory 224, and the adding circuits 254, 256 of FIG. 2A.

The method 400 further includes processing, at a second check node unit of the decoder, a second input associated with a second block row of the layer of the parity check matrix to generate second output, at 404. Processing at the second check node unit may occur in parallel (e.g., concurrently) with processing performed at the first check node unit. The second input received by the second check node unit may be stored at a second buffer coupled to the second check node unit. The second buffer, such as the second buffer 232 of FIG. 2A, may store the second input during processing of the second input by the second check node unit. The second check node unit may be included in the second check node units (CNUs) 184 of FIG. 1B or the second check node units (CNUs) 230 of FIG. 2A. The second output generated by the second check node unit may be included in the second outputs 192 of FIG. 1B or an output of the second check node units (CNUs) 230 of FIG. 2A. The second output may be provided to one or more components of the decoder, such as being provided to the first post processing circuitry 186, the second post processing circuitry 192 of FIG. 1B, the second memory 234, and the adding circuits 264, 266 of FIG. 2A.

The method 400 also includes performing first post processing of a buffered second input, the first output of the first check node unit, and the second output of the second check node unit to generate a first result based on a first computation, at 406. A length of a "critical path" of the decoder is reduced as compared to a "critical path" length of another decoder architecture in which a common feedback message is computed. For example, a "critical path" of the decoder 122 of FIG. 1B may include components configured to form the first results 194 at the first post processing circuitry 186 and to provide the first results 194, via the first path 178, to a second check node unit in the second check node units 184. The buffered second input used in the first post processing may be a buffered version of the second input, such as an output of the second buffer 198 of FIG. 1 or an output of the second buffer 232 of FIG. 2. The first result may be included in the first result 194 of FIG. 1B or an input of the second check node units (CNUs) 230 (e.g., an output of the adding circuits 262) of FIG. 2A.

The method 400 also includes performing second post processing of a buffered first input, the first output, and the second output to generate a second result based on a second computation, at 408. The buffered first input used in the second post processing may be a buffered version of the first input, such as an output of the first buffer 180 of FIG. 1 or an output of the first buffer 222 of FIG. 2. A length of a "critical path" of the decoder is reduced as compared to a "critical path" length of another decoder architecture in which a common feedback message is computed. For example, a "critical path" of the decoder 122 of FIG. 1B may include components configured to form the second results 196 at the second post processing circuitry 188 and to provide the second results 196, via the second path 176, to a first check node unit in the first check node units 182. The first result may be associated with a first block row of the layer and the second result may be associated with a second block row of the layer. The second post processing may be performed in parallel (e.g., concurrently) with the first post processing being performed. The second result may be included in the second result 196 of FIG. 1B or an input of the first check node units (CNUs) 220 (e.g., an output of the adding circuits 252) of FIG. 2A.

The decoder may include a first adding circuit, such as an adding circuit of the adding circuits 256 of FIG. 2A, that is configured to receive the first output (of the first check node unit) at a first input of the first adding circuit. The first adding circuit may be included in the first post processing circuitry 186 of FIG. 1A. A second input of the first adding circuit may be configured to receive another output of the first check node unit generated by the first check node unit in a previous iteration and stored in a first memory for use in a later iteration. For example, the other output may be received at the second input of the first adding circuit from a first memory of the decoder, such as from the first memory 224 of FIG. 2A. A first output (e.g., a first intermediate value) of the first adding circuit may be provided to a multiplexor, such as the second multiplexor 206 of FIG. 2A.

The first result may be provided to the second check node via a first path, such as the first path 178 of FIG. 1B. The first path 178 may include one or more components of the decoder 122. For example, the first path 178 may be associated with a "critical path" of the decoder 122. Additionally, the second result may be provided to the first check node via a second path, such as the second path 176 of FIG. 1B. The second path 176 may include one or more components of the decoder 122. For example, the second path 176 may be associated with a "critical path" of the decoder 122. The first path is distinct from the second path. Each of the first path and the second path may include (e.g., pass through) one or more components of the decoder. For example, the first path may include a first group of components and the second path may include a second group of components. To illustrate, the first path may include a multiplexor, such as the second multiplexor 206 of FIG. 2A, that is configured to select between channel information (e.g., the codeword data 174 of FIG. 1A or the channel information 202 of FIG. 2A) and a first intermediate value, such as a first intermediate value output by the adding circuits 256 of FIG. 2A. Additionally, the second path may include another multiplexor, such as the first multiplexor 204, that is configured to select between the channel information and a second intermediate value that is output by an adding circuit, such as an adding circuit included in the adding circuits 266 of FIG. 2A.

The multiplexor, such as the second multiplexor 206 of FIG. 2A, may receive the channel information and the first intermediate value. Based on a first control signal received at the multiplexor, the multiplexor may provide an output value to be provided to the second check node unit. The other multiplexor, such as the first multiplexor 204 of FIG. 2A, may receive the channel information and the second intermediate value. Based on a second control signal received at the other multiplexor, the other multiplexor may provide an output value to be provided to the first check node unit. The first control signal and the second control signal may be provided (e.g., generated) by control logic included in or corresponding to the decoder. Each of the multiplexors may be configured to select the channel information during the first layer of a first decoding iteration of the iterative decoding operation of the decoder.

By providing the first result to the second check nodes and by providing the second result to the first check nodes without generation of a common intrinsic message (e.g., a common feedback message), the decoder (e.g., a multi-block-row layered decoder) may be configured with a substantially shorter "critical path" than previously proposed multi-block-row layered decoders that process a same number of block-rows per layer.

One or more operations or functions, as described herein in relation to FIGS. 1-4, may be initiated or controlled by a field-programmable gate array (FPGA) device, an application-specific integrated circuit (ASIC), a processing unit, such as a central processing unit (CPU), a digital signal processor (DSP), a controller, another hardware device, a firmware device, or any combination thereof. As an example, one or more operations or functions, as described herein in relation to FIGS. 1-4, can be initiated or controlled by one or more processors included in or coupled to the data storage device 102 of FIG. 1A, such as one or more processors included in or coupled to the controller 120 and/or the decoder 122 of FIG. 1A, or one or more processors (or controllers) included in the host device 130 of FIG. 1A.

A controller configured to perform one or more operations or functions, as described herein in relation to FIGS. 1-4, may be able to perform multi-block-row layered decoding. Although various components of the data storage device 102 depicted herein are illustrated as block components and described in general terms, such components may include one or more microprocessors, state machines, or other circuits configured to enable the controller 120 and/or the decoder 122 of FIG. 1A to perform operations described herein. One or more aspects of the controller 120 and/or the decoder 122 may be implemented using a microprocessor or microcontroller programmed to perform operations described herein, such as one or more operations or functions, as described herein in relation to FIGS. 1-4. In a particular embodiment, the controller 120 and/or the decoder 122 includes a processor executing instructions that are stored at the memory 104. Alternatively or additionally, executable instructions that are executed by the processor may be stored at a separate memory location that is not part of the memory 104, such as at a read-only memory (ROM).

The controller 120 and/or the decoder 122 of FIG. 1A may be implemented using a microprocessor or microcontroller programmed to perform one or more operations or functions, as described herein in relation to FIGS. 1-4. For example, the microprocessor or microcontroller may be configured to execute instructions to perform certain operations described herein. In a particular embodiment, the controller 120 and/or the decoder 122 (e.g., the microprocessor or microcontroller) includes a processor executing instructions that are stored at the memory 104. Alternatively, executable instructions that are executed by the processor may be stored at a separate memory location that is not part of the memory 104, such as at a read-only memory (ROM).

In an illustrative example, the processor may execute the instructions to process a first block row of a layer of a parity check matrix to generate first outputs. The instructions to process the first block row may include instructions to receive channel information and/or codeword data, instructions to process the channel information and/or the codeword data, and/or instructions to output the first outputs, as illustrative, non-limiting examples. The processor may also execute instructions to process a second block row of the layer of the parity check matrix to generate second outputs. The instructions to process the second row may include instructions to receive channel information and/or codeword data, instructions to process the channel information and/or the codeword data, and/or instructions to output the second outputs, as illustrative, non-limiting examples. The processor may also execute instructions to perform first post processing of the first outputs of a first group of check node units to generate first results based on a first computation. The instructions to perform first post processing may include instructions to process the first output data along a first path, instructions to perform one or more additions, instructions to provide a control signal to a multiplexor, instructions to perform one or more routing network operations, instructions to generate the first results, instructions to provide the first results to the second check node units, and/or instructions to store the first outputs in a memory, as illustrative, non-limiting examples. The processor may also execute instructions to perform second post processing of the second outputs of a second group of check node units to generate second results based on a second computation. The first results may be different than the second results in at least one iteration of an iterative decoding operation. The instructions to perform first post processing may include instructions to process the first output data along a second path, instructions to perform one or more additions, instructions to provide a control signal to a multiplexor, instructions to perform one or more routing network operations, instructions to generate the second results, instructions to provide the first results to the first check node units, and/or instructions to store the second outputs in a memory, as illustrative, non-limiting examples.

In a particular embodiment, the data storage device 102 may be attached to or embedded within one or more host devices, such as within a housing of a host communication device, which may correspond to the host device 130. The data storage device 102 may be within a packaged apparatus such as a wireless telephone, a personal digital assistant (PDA), a gaming device or console, a portable navigation device, a computer device (e.g., a tablet or a laptop), or other device that uses internal non-volatile memory. However, in other embodiments, the data storage device 102 may be a portable device configured to be selectively coupled to one or more external devices, such as the host device 130. For example, the data storage device 102 may be a removable device such as a Universal Serial Bus (USB) flash drive or a removable memory card, as illustrative examples.

The host device 130 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 130 may communicate via a host controller, which may enable the host device 130 to communicate with the data storage device 102. The host device 130 may operate in compliance with a JEDEC Solid State Technology Association industry specification, such as an embedded MultiMedia Card (eMMC) specification or a Universal Flash Storage (UFS) Host Controller Interface specification. The host device 130 may operate in compliance with one or more other specifications, such as a Secure Digital (SD) Host Controller specification, as an illustrative example. Alternatively, the host device 130 may communicate with the data storage device 102 in accordance with another communication protocol.

The memory 104 may have a two-dimensional configuration, a three-dimensional (3D) configuration (e.g., a 3D memory), or any other configuration, and may include a single die or multiple dies (e.g., multiple stacked memory dies). The data storage device 102 may be configured to be coupled to the host device 130 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

Semiconductor memory devices, such as the memory 104, include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device level. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the memory 104 is a non-volatile memory having a three-dimensional (3D) memory configuration that is monolithically formed in one or more physical levels of arrays of memory cells having an active area disposed above a silicon substrate. The data storage device 102 includes circuitry, such as the read circuitry 140 and/or the write circuitry of FIG. 1A, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate controller chip and/or on the same substrate as the memory elements One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
   a non-volatile memory; and
   a controller operatively coupled to the non-volatile memory, the controller including a decoder that is configured to perform an iterative decoding operation using codeword data read from the non-volatile memory, wherein the decoder comprises:
      a first check node unit configured to process a first input associated with a first block row of a layer of a parity check matrix;
      a second check node unit configured to process a second input associated with a second block row of the layer of the parity check matrix;
      first processing circuitry configured to receive a buffered second input from a second buffer, a first output of the first check node unit, and a second output of the second check node unit and to output a first result based on a first computation; and
      second processing circuitry configured to receive a buffered first input from a first buffer, the first output, and the second output and to output a second result based on a second computation,
      wherein a length of a critical path of the decoder is reduced as compared to a critical path length in which a common feedback message is computed.

2. The data storage device of claim 1, wherein the critical path includes components configured to form the first result and to provide the first result via a first path to the second check node unit.

3. The data storage device of claim 1, wherein:
   the decoder includes a low-density parity check (LDPC) decoder, and
   the critical path is a shortest among multi-block row layer decoders.

4. The data storage device of claim 1, wherein:
   the first result is associated with the first block row of the layer,
   the second result is associated with the second block row of the layer, and
   the first result is distinct from the second result.

5. The data storage device of claim 1, further comprising a first memory coupled to the first check node unit and a second memory coupled to the second check node unit.

6. The data storage device of claim 5, wherein:
   the first processing circuitry includes a first adding circuit, and
   the first adding circuit includes a first input configured to receive the first output from the first check node unit and a second input configured to receive a third output from the first memory.

7. The data storage device of claim 6, wherein:
   the first check node unit is configured to generate the third output during a previous iteration, and
   the first memory is configured to store the third output for use in a later iteration.

8. The data storage device of claim 1, further comprising:
   a first path configured to provide the first result to the second check node unit; and
   a second path configured to provide the second result to the first check node unit,
   wherein the first path is distinct from the second path.

9. The data storage device of claim 8, wherein:
   the second path includes a first multiplexor configured to select between the codeword data and a second intermediate value, and
   the first path includes a second multiplexor configured to select between the codeword data and a first intermediate value.

10. The data storage device of claim 9, wherein the first multiplexor and the second multiplexor are configured to select the codeword data during decoding of a first layer.

11. The data storage device of claim 1, wherein:
    the first buffer is configured to store the first input during processing of the first input by the first check node unit, and
    the second buffer is configured to store the second input during processing of the second input by the second check node unit.

12. The data storage device of claim 1, wherein:
    the non-volatile memory includes a three-dimensional (3D) memory configuration that is monolithically formed in one or more physical levels of arrays of storage elements having an active area disposed above a silicon substrate, and
    the data storage device includes circuitry associated with operation of the storage elements.

13. A method comprising:
    in a data storage device including a controller and a non-volatile memory, wherein the controller includes a decoder configured to perform an iterative decoding operation using codeword data read from the non-volatile memory, performing:
        processing, at a first check node unit of the decoder, a first input associated with a first block row of a layer of a parity check matrix to generate a first output;
        processing, at a second check node unit of the decoder, a second input associated with a second block row of the layer of the parity check matrix to generate a second output;

performing first processing of a buffered second input from a second buffer, the first output of the first check node unit, and the second output of the second check node unit to generate a first result based on a first computation; and performing second processing of a buffered first input from a first buffer, the first output, and the second output to generate a second result based on a second computation, wherein a length of a critical path of the decoder is reduced as compared to a critical path length in which a common feedback message is computed.

14. The method of claim 13, wherein the parity check matrix includes a low-density parity-check (LDPC) matrix.

15. The method of claim 13, further comprising:

receiving, at a first input of a first adding circuit included in first processing circuitry, the first output from the first check node unit; and receiving, at a second input of the first adding circuit, another output of the first check node unit, wherein the other output is generated by the first check node unit during a previous iteration and stored in a first memory for use in a later iteration.

16. The method of claim 13, further comprising:

providing the first result to the second check node unit via a first path; and providing the second result to the first check node unit via a second path, wherein the first path is distinct from the second path.

17. The method of claim 16, wherein:

the first path includes a first multiplexor that selects between the codeword data and a second intermediate value, and the second path includes a second multiplexor that selects between the codeword data and a first intermediate value.

18. The method of claim 13, wherein the first buffer is coupled to the first check node unit, wherein the second buffer is coupled to the second check node unit, and further comprising:

storing the first input at the first buffer during processing of the first input by the first check node unit; and storing the second input at the second buffer during processing of the second input by the second check node unit.

19. The method of claim 13, wherein:

the non-volatile memory includes a three-dimensional (3D) memory configuration that is monolithically formed in one or more physical levels of arrays of storage elements having an active area disposed above a silicon substrate, and the data storage device includes circuitry associated with operation of the storage elements.

20. A data storage device comprising:

means for storing information; and means for controlling the means for storing, the means for controlling including means for iteratively decoding data using codeword data read from the means for storing, wherein the means for iteratively decoding comprises:

first check node means for processing a first input associated with a first block row of a layer of a parity check matrix;

second check node means for processing a second input associated with a second block row of the layer of the parity check matrix;

first processing means for receiving a buffered second input from a second means for buffering, a first output of the first check node means, and a second output of the second check node means and for outputting a first result based on a first computation; and second processing means for receiving a buffered first input from a first means for buffering, the first output, and the second output and for outputting a second result based on a second computation, wherein a length of a critical path of the means for iteratively decoding is reduced as compared to a critical path length in which a common feedback message is computed.

* * * * *